US009846422B2

United States Patent
Jimi et al.

(10) Patent No.: US 9,846,422 B2
(45) Date of Patent: Dec. 19, 2017

(54) SIGNAL PROCESSING APPARATUS

(71) Applicant: YOKOGAWA ELECTRIC CORPORATION, Musashino-shi, Tokyo (JP)

(72) Inventors: Hiroyuki Jimi, Tokyo (JP); Shunsuke Hayashi, Tokyo (JP); Ikutomo Watanabe, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 610 days.

(21) Appl. No.: 14/510,295

(22) Filed: Oct. 9, 2014

(65) Prior Publication Data

US 2015/0120004 A1 Apr. 30, 2015

(30) Foreign Application Priority Data

Oct. 29, 2013 (JP) ................. 2013-223891

(51) Int. Cl.
*H05B 37/02* (2006.01)
*H02J 13/00* (2006.01)
(Continued)

(52) U.S. Cl.
CPC ......... *G05B 19/0423* (2013.01); *G01D 21/00* (2013.01); *G01R 31/2829* (2013.01); *G05B 2219/21127* (2013.01)

(58) Field of Classification Search
CPC .......... G05B 19/41885; G05B 19/0423; H03H 7/40; Y02T 10/7005; Y02T 10/7072;
(Continued)

(56) References Cited

U.S. PATENT DOCUMENTS 5,948,077 A 9/1999 Choi et al.
6,460,094 B1 10/2002 Hanson et al.
(Continued)

FOREIGN PATENT DOCUMENTS

CN 1465984 A 1/2004
CN 1257411 C 5/2006
(Continued)

OTHER PUBLICATIONS

Wei et al., Integrated circuit security techniques using variable supply voltage, Jun. 2011, 6 pages.*

*Primary Examiner* — Thuy Dao
(74) *Attorney, Agent, or Firm* — Westerman, Hattori, Daniels & Adrian

(57) ABSTRACT

A signal processing apparatus includes an interface module and a signal processing module. The interface module includes an identification resistance for identifying the interface module, the interface module being connectable to a device configured to perform at least one of measuring of a measuring target and operating of an operation target. The signal processing module includes a first connection terminal connected to one end of the identification resistance, a first power source connected to the identification resistance via the first connection terminal, a detector configured to detect any one of voltage and electrical current at the first connection terminal, and a signal processor configured to process signals received from and transmitted to the device.

17 Claims, 7 Drawing Sheets

(51) Int. Cl.
*H05B 33/08* (2006.01)
*G05B 19/04* (2006.01)
*G05B 19/042* (2006.01)
*G01R 31/28* (2006.01)
*G01D 21/00* (2006.01)

(58) Field of Classification Search
CPC .......................... Y02T 90/14; H05B 37/0227; H05B 37/0218; H02J 13/0079; H02J 13/0086
See application file for complete search history.

(56) References Cited

U.S. PATENT DOCUMENTS

| | | | |
|---|---|---|---|
| 7,290,164 B1 | 10/2007 | Harvey et al. | |
| 8,364,961 B2* | 1/2013 | Tanaka | H04L 9/32 713/168 |
| 8,712,590 B2* | 4/2014 | Steinberg | G05D 23/1923 700/276 |
| 9,232,617 B2* | 1/2016 | Matsumoto | H05B 41/18 |
| 9,647,495 B2* | 5/2017 | Bonicatto | H02J 13/0086 |
| 2002/0099878 A1 | 7/2002 | Henrie et al. | |
| 2005/0268000 A1 | 12/2005 | Carlson | |
| 2006/0289511 A1 | 12/2006 | Miyazaki et al. | |
| 2010/0201514 A1* | 8/2010 | Barna | H02J 13/0079 340/539.22 |
| 2010/0277224 A1* | 11/2010 | Jockel | G01D 5/24452 327/530 |
| 2012/0082204 A1* | 4/2012 | Iwano | G08C 19/02 375/238 |
| 2012/0143383 A1* | 6/2012 | Cooperrider | H04Q 9/00 700/295 |

FOREIGN PATENT DOCUMENTS

| | | |
|---|---|---|
| CN | 1799188 A | 7/2006 |
| CN | 202841070 U | 3/2013 |
| EP | 2871853 A1 | 5/2015 |
| JP | 10143463 A | 5/1998 |
| JP | 2001178734 A | 7/2001 |
| JP | 2002-180895 A | 6/2002 |
| JP | 3430287 B2 | 7/2003 |
| JP | 2004094421 A | 3/2004 |

* cited by examiner

SIGNAL PROCESSING APPARATUS

BACKGROUND OF THE INVENTION

Field of the Invention

The present invention relates to a signal processing apparatus.

Priority is claimed on Japanese Patent Application No. 2013-223891, filed Oct. 29, 2013, the contents of which are incorporated herein by reference.

Description of Related Art

A process control system provided in a plant or a factory or the like generally includes on-site devices called field devices (measuring devices, and actuators), a controller controlling the field devices, and a host device managing or controlling the field devices and the controller. The field devices, the controller, and the host device are in connection with one another via a communication means. In such a process control system, the collector is for collecting process values (for example, measured values of the pressure, the temperature, and the flow rate) obtained by the field devices, and controlling the field devices based on the collected process values under the control of the host device.

A system for measuring and recording physical quantity (for example, a pressure, a temperature, a flow rate, and optical power) includes a sensor for detecting the physical quantity, and a signal processing apparatus (for example, power meters, and recorders) connected to the sensor. In such a system, the signal processing apparatus is for collecting signals detected by the sensor, and performing a pre-determined processing (for example, a measuring processing, and a recording processing).

Japanese Patent No. 3430287 discloses a modular measuring device connected to a personal computer and capable of performing a measurement under the control of the personal computer. The modular measuring device includes a memory for recording information of the type of module or the like. The personal computer is for reading the information of the type of module recorded in the memory of the module to recognize the type of module.

There are various types of field devices, which are used for the above-stated process control system, depending on its measuring targets and its operation targets. The forms of the signals input to and output from the field device are variable. There are some cases where various types of field devices supplied from various vendors are used in the above-stated process control system. Therefore, it is often the case that a signal processing apparatus (specifically, a signal processing apparatus including an interface module and an I/O module) for performing a signal processing enabling various field devices to be connected to the controller is provided between the field device and the controller in the above-stated process control system. In the above-stated system for measuring and recording physical quantity, the more the types of and the number of the connected sensors increase, the more modules including similar functions to those of the interface module are used.

The more the types of the connected field devices increase, the more the number of the interface modules increases. The interface modules including functions depending on the signal form of the connected field device are used. For example, if it is necessary to convert signals output from the field device, the interface module including a function of converting signals is used. Therefore, since, as with the case of the field devices, the various types of interface modules are used, it is necessary to identify the type of the interface module by the controller, for example, in order to facilitate maintenance in case of trouble.

The following methods (1) to (3) are considered as a method for identifying an interface module.

(1) A method of providing a memory disclosed in Japanese Patent No. 3430287 to the interface module (2) A method of providing a CPU (central processing unit) to the interface module (3) A method of providing a port for outputting a plurality of bits of signals to the interface module In the method (1), identification information stored in the memory is read to identify the type of the interface module. In the method (2), the communication with CPU is performed to identify the type of the interface module. In the method (3), for example, a plurality of pull-up resistors or pull-down resistors, each of which specifies the level of bit string output from the port, is provided and the bit string output from the port is referred to identify the type of the interface module.

In the methods (1) to (3), there are some cases where the cost is increased, or the number of the wirings connected to the interface module is increased. In the methods (1) and (2), it is thought that it is possible to perform notification of a problem in the interface module (for example, a misalignment of wiring connected to a field device). However, in the method (3), there are some cases where notification of the problem cannot be performed.

SUMMARY OF THE INVENTION

One aspect of the present invention provides a signal processing apparatus capable of identifying an interface module without significantly increasing the cost and the number of wirings, in addition, of performing notification of a problem in the interface module.

A signal processing apparatus according to one aspect of the present invention may include an interface module and a signal processing module. The interface module may include an identification resistance for identifying the interface module, the interface module being connectable to a device configured to perform at least one of measuring of a measuring target and operating of an operation target. The signal processing module may include a first connection terminal connected to one end of the identification resistance, a first power source connected to the identification resistance via the first connection terminal, a detector configured to detect any one of voltage and electrical current at the first connection terminal, and a signal processor configured to process signals received from and transmitted to the device.

In the signal processing apparatus described above, the interface module may further include a changer configured to change any one of voltage and electrical current at the identification resistance, and an abnormality detector configured to detect an abnormality in the interface module and to change a current operational state of the changer.

In the signal processing apparatus described above, the interface module may further include a second connection terminal connected to the first connection terminal. The one end of the identification resistance may be connected to the first connection terminal via the second connection terminal. Other end of the identification resistance may be connected to ground. The changer may include a first switch parallelly connected to the identification resistance between the second connection terminal and the ground. When the abnormality detector detects an abnormality in the interface module, the abnormality detector may be configured to change the first switch to an ON state.

In the signal processing apparatus described above, the changer may further include an abnormality notification circuit. The abnormality notification circuit may include an abnormality notification resistance used for notifying the type of abnormality in the interface module and a second switch connected to the abnormality notification resistance. The abnormality detector may be configured to change any one of the first switch and the second switch to an ON state depending on the type of the detected abnormality of the interface module.

In the signal processing apparatus described above, the interface module may further include a second power source connected to one end of the abnormality notification circuit. Other end of the abnormality notification circuit may be connected to the one end of the identification resistance. The second switch, the abnormality notification resistance, and the identification resistance may be serially connected between the second power source and the ground.

In the signal processing apparatus described above, the abnormality notification circuit may be parallelly connected to the identification resistance between the second connection terminal and the ground.

In the signal processing apparatus described above, the interface module may further include an oscillator connected to the one end of the identification resistance, and an abnormality detector configured to make the oscillator oscillate or to change an oscillation frequency of the oscillator change when the abnormality detector detects the abnormality of the interface module.

In the signal processing apparatus described above, the abnormality detector may be configured to set the oscillation frequency of the oscillator depending on the type of the detected abnormality of the interface module.

In the signal processing apparatus described above, the interface module may further include a capacitor configured to alternating-current couples the oscillator to the one end of the identification resistance.

In the signal processing apparatus described above, the interface module may further include a device type identification circuit. The device type identification circuit may include a device type identification resistance configured to identify the type of the device, and a device type identification terminal connected to the device type identification resistance and configured to be opened or shorted depending on the type of the device.

In the signal processing apparatus described above, the interface module may further include a second power source connected to one end of the device type identification circuit. Other end of the device type identification circuit may be connected to the one end of the identification resistance. Other end of the identification resistance may be connected to ground. The device type identification terminal, the device type identification resistance, and the identification resistance may be serially connected between the second power source and the ground.

In the signal processing apparatus described above, the interface module may further include a second connection terminal connected to the first connection terminal. The one end of the identification resistance may be connected to the first connection terminal via the second connection terminal Other end of the identification resistance may be connected to ground. The device type identification circuit may be parallelly connected to the identification resistance between the second connection terminal and the ground.

In the signal processing apparatus described above, the interface module may further include a device type identification circuit. The device type identification circuit may include a device type identification resistance configured to identify the type of the device, and a device type identification terminal connected to a resistance having a resistance value depending on the type of the device.

In the signal processing apparatus described above, the interface module may further include a second power source connected to one end of the device type identification circuit. Other end of the device type identification circuit may be connected to the one end of the identification resistance. Other end of the identification resistance may be connected to ground. The device type identification terminal, the device type identification resistance, and the identification resistance may be serially connected between the second power source and the ground.

In the signal processing apparatus described above, the interface module may further include a second connection terminal connected to the first connection terminal. The one end of the identification resistance may be connected to the first connection terminal via the second connection terminal Other end of the identification resistance may be connected to ground. The device type identification circuit may be parallelly connected to the identification resistance between the second connection terminal and the ground.

In the signal processing apparatus described above, other end of the identification resistance may be connected to ground. The signal processing module may further include a voltage dividing resistance provided between the first power source and the first connection terminal. The voltage dividing resistance may be serially connected to the identification resistance via the first connection terminal, and configured to divide the voltage of the power source.

In the signal processing apparatus described above, the signal processing module may further include a constant current source configured to supply constant electrical current to the identification resistance via the first connection terminal.

In the signal processing apparatus described above, the detector may include an analog-to-digital converter. The analog-to-digital converter may include an input terminal connected to the first connection terminal, and be configured to convert any one of voltage and electrical current at the first connection terminal into a digital signal.

In the signal processing apparatus described above, the signal processing module may further include a recognizer disposed between the analog-to-digital converter and the signal processor. The recognizer may be configured to recognize the type of the interface module based on the digital signal output from the analog-to-digital converter, and to input the recognition result into the signal processor.

In the signal processing apparatus described above, the signal processing module may further include an abnormality processor disposed between the analog-to-digital converter and the signal processor. The abnormality processor may be configured to recognize an abnormality in the interface module based on the digital signal output from the analog-to-digital converter, and to input the recognition result into the signal processor.

According to one aspect of the present invention, since the identification resistance provided in the interface module and the power source provided in the signal processing module are connected via the connection terminal of the signal processing module and the detector provided in the signal processing module is configured to detect the voltage (the voltage at the connection terminal of the signal processing module) or the electrical current at the resistance provided in the interface module, the present invention allows for the identification of the interface module without significantly increasing the cost and the number of wirings.

In addition, since the changer for changing the voltage and the electrical current using the identification resistance of the interface module is provided and the changer is configured to be changed when a problem is detected in the interface module, the present invention allows for the notification of the problem in the interface module based on the changing of the voltage or the electrical current at the connection terminal of the signal processing module.

DETAILED DESCRIPTION OF THE INVENTION

Hereinafter, signal processing apparatuses according to embodiments of the present invention will be described in detail, with references made to the drawings.

First Embodiment

Figure 1:
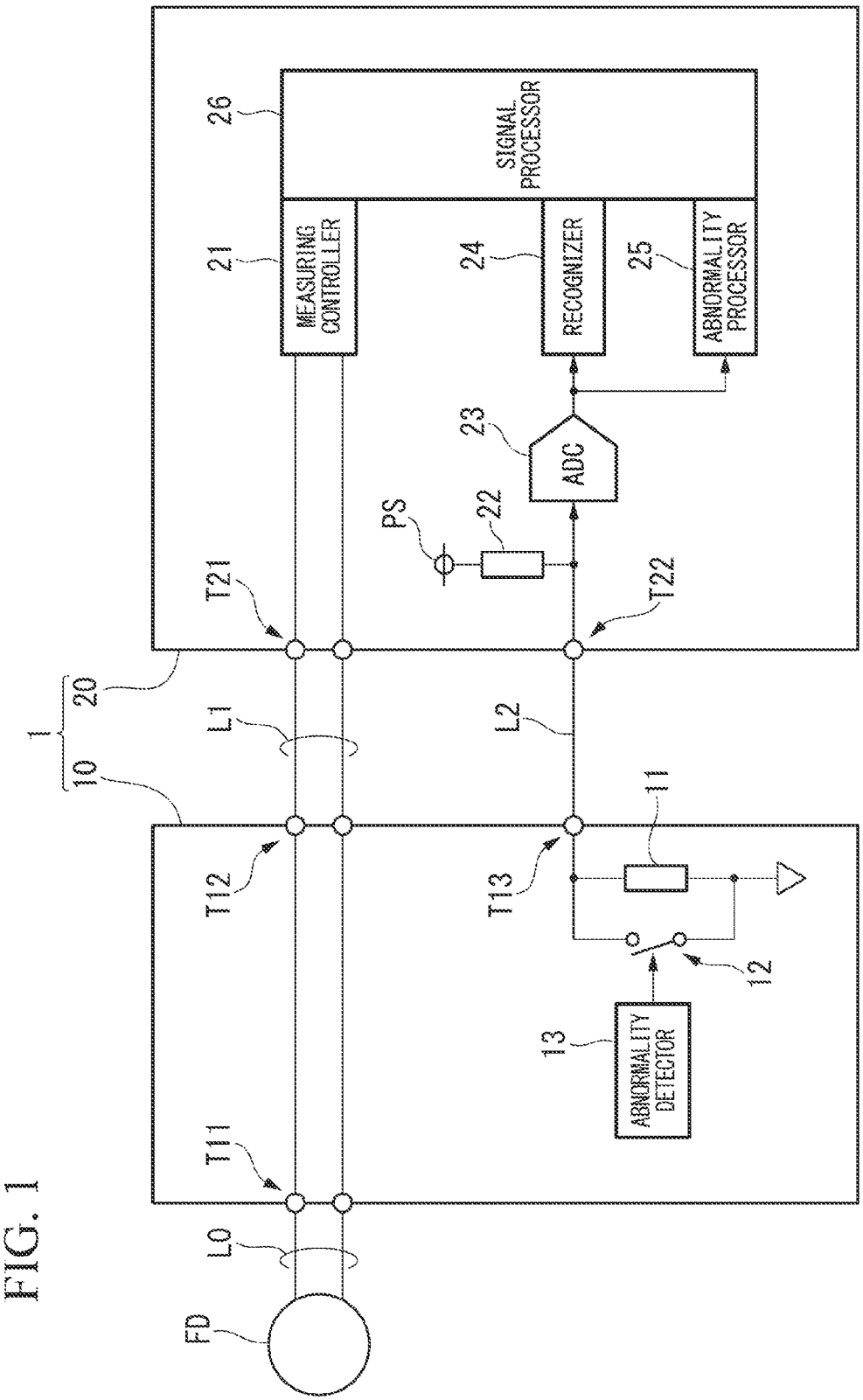
FIG. 1 is a block diagram showing the main parts of the constitution of a signal processing apparatus according to a first embodiment of the present invention.

FIG. 1 is a block diagram showing the main parts of the constitution of a signal processing apparatus according to a first embodiment of the present invention. As shown in FIG. 1, a signal processing apparatus 1 according to the first embodiment includes an interface module 10 and a signal processing module 20, is in connection with a field device FD (device), and performs pre-determined processing for signals transmitted to and received from the field device FD. A plurality of field devices FD and interface modules 10 may be provided with respect to the signal processing module 20.

In order to simplify the drawing, one field device FD and one interface module 10 are shown in FIG. 1.

The field device FD is installed on site, for example, a plant or a factory, and performs at least one of measuring of a measuring target and operating of an operation target required for the control of an industrial process. Specifically, the field device FD includes, for example, a sensor device such as a flow gauge or temperature sensor, a valve device such as a flow rate control valve or open and close value, an actuator device such as a fan or motor, an imaging device such as a camera or video for taking an image of a target or the situation in a plant, an acoustic device such as a microphone or speaker for collecting abnormal noise and the like in a plant or emitting a warning sound and the like, a position detection device for outputting position information of each device, and other devices. Hereinafter, to facilitate understanding of the following description, a description will be provided for the case in which the field device FD is a sensor device for measuring a flow rate of a liquid.

The interface module 10 is provided between the field device FD and the signal processing module 20 so that the interface module 10 enables various field devices FD to be connected to the signal processing module 20. The interface module 10 includes a signal processing circuit configured to perform a signal conversion processing depending on the form of a signal output from and input into the field device FD and the like. If the signal conversion processing and the like are unnecessary, the signal processing circuit may be omitted. In order to simplify the drawing, the interface module 10, which does not include the signal processing circuit, is shown in FIG. 1. The interface module 10 shown in FIG. 1 does not have a power source.

As shown in FIG. 1, the interface module 10 includes connection terminals T11 to T13, a resistance 11 (identification resistance), a switch 12 (first switch, changer), and an abnormality detector 13. The connection terminal T11 is in connection with one end of a connection line L0. The other end of the connection line L0 is in connection with the field device FD. Signals, which are input into and output from the field device FD, are input into and output from the connection terminal T11. The connection terminal T12 is in connection with the connection terminal T11 in the interface module 10, and is in connection with a connection terminal T21 (details of the connection terminal T21 will be described later) in the signal processing module 20 via a connection line L1. The signals, which have been output from the field device FD, are output from the connection terminal T12. Signals, which have been output from the signal processing module 20, are input into the connection terminal T12. If the signal processing circuit is provided in the interface module 10, the signal processing circuit is provided between the connection terminals T11 and T12.

In order to eliminate the influence of noise, differential signals are output from and input into the field device FD. Therefore, the field device FD and the interface module 10 are connected via the connection line L0 to construct a balanced line system, and the interface module 10 and the signal processing module 20 are connected via the connection line L1 to construct a balanced line system. Therefore, the noise resistance of the line, in which the signals input into and output from the field device FD are transmitted, is improved.

The connection terminal T13 is in connection with a connection terminal T22 (details of the connection terminal T22 will be described later) in the signal processing module 20 via a connection line L2. Signals, which identify the interface module 10 or indicate the abnormality in the interface module 10, are output from the connection terminal T13. In order to reduce the number of the signal lines, the interface module 10 and the signal processing module 20 are connected via the connection line L2 to construct an unbalanced line system.

The resistance 11 is provided to identify the interface module 10. The resistance value of the resistance 11 differs for each interface module 10. One end of the resistance 11 is in connection with the connection terminal T13, and the other end of the resistance 11 is in connection with ground. The resistance value of the resistance 11 may be arbitrarily set, for example, is set to be approximately several to several tens of kΩ. The resistance 11 is serially connected to a resistance 22 provided in the signal processing module 20 between a power source PS and the ground, and divides a voltage of the power source PS provided in the signal processing module 20 in conjunction with the resistance 22. Details of the resistance 11 will be described later.

The switch 12 is a mechanical switch parallelly connected to the resistance 11 between the connection terminal T13 and the ground and used for notifying the signal processing module 20 of the abnormality in the interface module 10. The ON state and OFF state of switch 12 are controlled by the abnormality detector 13. The switch 12 may be serially connected to the resistance 11. The abnormality detector 13 is for mechanically detecting the abnormality in the interface module 10. When the abnormality detector 13 detects the abnormality, the abnormality detector 13 changes the switch 12 to the ON state. The abnormality in the interface module 10 includes, for example, the misalignment of the connection line L0 connected to the field device FD.

The signal processing module 20 is in connection with the interface module 10 via the connection lines L1 and L2, and performs a pre-determined processing for the signals transmitted to and received from the field device FD via the interface module 10. For example, the signal processing module 20 performs an acquisition processing of data (measured data of flow rate) from the field device FD by controlling the field device FD, a conversion processing into a digital signal of data acquired from the field device FD, and another processing.

The signal processing module 20 includes connection terminals T21 and T22, a measuring controller 21, a power source PS, a resistance 22 (voltage-dividing resistance), an analog-to-digital converter (ADC) 23 (detector), a recognizer 24, an abnormality processor 25, and a signal processor 26. The connection terminal T21 is in connection with the connection terminal T12 of the interface module 10 via the connection line L1. Signals output from the field device FD via the interface module 10 are input into the connection terminal T21, and signals for the field device FD are output from the connection terminal T21.

The connection terminal T22 is in connection with the connection terminal T13 of the interface module 10 via the connection line L2. Signals, which identify the interface module 10 or indicate the abnormality in the interface module 10, are input into the connection terminal T22. Since the one end of the resistance 11 is in connection with the connection terminal T13 of the interface module 10, the connection terminal T22 is in connection with the one end of the resistance 11 provided in the interface module 10 via the connection line L2.

The measuring controller 21 is in connection with the connection terminal T21, and controls the measurement of the field device FD. Namely, the measuring controller 21 outputs to the connection terminal T21 the control signals for acquiring data (measured data of flow rate) from the field device FD, acquires the data (measured data of flow rate) output from field device FD via the connection terminal T21, and output the data to the signal processor 26.

The resistance 22 is provided between the power source PS and the connection terminal T22, and is serially connected to the resistance 11 of the interface module 10 via the connection terminal T22, the connection line L2, and the connection terminal T13 between the power source PS and the ground. The resistance 22 divides the voltage of the power source PS in conjunction with the resistance 11 provided in the interface module 10. As with the case of the resistance 11, the resistance value of the resistance 22 may be arbitrarily set, for example, is set to be approximately several to several tens of KΩ. The power source PS is a direct-current power source in which the output voltage is, for example, approximately several to several tens of V.

The input terminal of ADC 23 is in connection with the connection terminal T22. The ADC 23 converts the voltage at the connection terminal T22 to a digital signal. Namely, the resistance 11 and the resistance 22, which are serially connected to each other between the power source PS and the ground, divide the voltage of the power source PS into divided voltages, and the ADC 23 converts the divided voltage at the resistance 11 into a digital signal. The recognizer 24 recognizes the type of the interface module 10 based on the digital signal output from the ADC 23, and the recognition result is input into the signal processor 26. The abnormality processor 25 recognizes the abnormality in the interface module 10 based on the digital signal output from the ADC 23, and the recognition result is input into the signal processor 26.

The signal processor 26 performs a pre-determined processing for signals output from the measuring controller 21 and signals to be input into the measuring controller 21. For example, the signal processor 26 performs a conversion processing into digital signals for signals (analog signals) output from the measuring controller 21. The signal processor 26 also performs a processing of communicating with a host controller (not shown) to transmit the recognition results of the recognizer 24 and the abnormality processor 25.

Next, the operation of the signal processing apparatus 1 having the above-stated constitution will be described. Hereinafter, the operation when the signal processing module 20 recognizes the type of the interface module 10 (type recognition operation) and the operation when the signal processing module 20 recognizes the abnormality in the interface module 10 (abnormality recognition operation) will be described.

<Type Recognition Operation>

The following descriptions will be made, assuming that a worker connects one end of the connection line L2 to the connection terminal T13 of the interface module 10 and connects the other end of the connection line L2 to the connection terminal T22 of the signal processing module 20. Thereby, a circuit in which the resistance 11 of the interface module 10 and the resistance 22 of the signal processing module 20 are serially connected via the connection terminal T13, the connection line L2, and the connection terminal T22 between the power source PS and the ground, is formed. Since one end of the circuit is in connection with the power source PS and the other end is in connection with ground, the output voltage of the power source PS is divided by the resistance 11 and the resistance 22.

The resistances 11 and 22 divide the power voltage. The voltage at the connection terminal T22 of the signal processing module 20 is equal to that across the resistance 11 of the divided voltages. For example, when the resistance value of the resistance 22 is equal to 10 [kΩ], the resistance value of the resistance 11 is equal to 5 [kΩ], and the output voltage of the power source PS is equal to 10 [V], the voltage at the connection terminal T22 is equal to approximately 3.3 [V]. When the resistance value of the resistance 11 is equal to 10 [kΩ], the voltage at the connection terminal T22 is equal to 5 [V]. When the resistance value of the resistance 11 is equal to 20 [kΩ], the voltage at the connection terminal T22 is equal to approximately 6.7 [V].

Since the input terminal of ADC 23 is in connection with the connection terminal T22, the voltage at the connection terminal T22 is converted into a digital signal, then, the digital signal is input into the recognizer 24. When the digital signal from the ADC 23 is input into the recognizer 24, the recognizer 24 recognizes the type of the interface module 10 based on the value indicated by the digital signal, and inputs the recognition result into the signal processor 26. Thereby, the type of the interface module 10 is recognized.

When the interface module 10 is not in connection with the connection terminal T22 of the signal processing module 20, the connection terminal T22 is electrically open. In this case, the voltage at the connection terminal T22 is equal to the output voltage of the power source PS. Since the digital signal output from the ADC 23 indicates the output voltage of the power source PS, the recognizer 24 can recognize that the interface module 10 is not in connection with the signal processing module 20. As stated above, in the first embodiment, the recognizer 24 can recognize not only the type of the interface module 10, but also whether the interface module 10 is in connection with the signal processing module 20 or not.

<Abnormality Recognition Operation>

The following descriptions will be made, assuming that, as shown in FIG. 1, in the state that the field device FD is in connection with the interface module 10 via the connection line L0, the connection line L0 is misaligned from the interface module 10 for some reason. The abnormality detector 13 detects the misalignment of the connection line L0, and changes the switch 12 to an ON state. Then, both ends of the resistance 11 are shorted, the connection terminal T22 is in connection with ground via the switch 12. Thereby, since the digital signal output from the ADC 23 indicates 0 [V], the abnormality processor 25 can recognize the abnormality in the interface module 10.

As stated above, in the first embodiment, the resistances 11 which have different resistance value from each other are provided in each interface module 10, the output voltage of the power source PS is divided by the circuit in which the resistance 11 and the resistance 22 provided in the signal processing module 20 are serially connected between the power source PS and the ground. The ADC 23 converts the voltage at the resistance 11 (the voltage at the connection terminal T22) into a digital signal, and the type of the interface module 10 is recognized based on the value of the obtained digital signal. When the abnormality occurs in the interface module 10, the switch 12 parallelly connected to the resistance 11 between the connection terminal T13 and the ground is set to the ON state to short the resistance 11.

As stated above, in the first embodiment, the type of the interface module 10 can be recognized by just connecting the interface module 10 and the signal processing module 20 via the connection line L2. The type of the interface module 10 can be recognized without significantly increasing the cost and the number of wirings. In addition, in the first embodiment, not only the recognition of the type of the interface module 10, but also the notification of the abnormality in the interface module 10 is possible. In the first embodiment, the recognition of the type of the interface module 10 and the notification of the abnormality in the interface module 10 are possible without providing a power source to the interface module 10.

Figure 2:
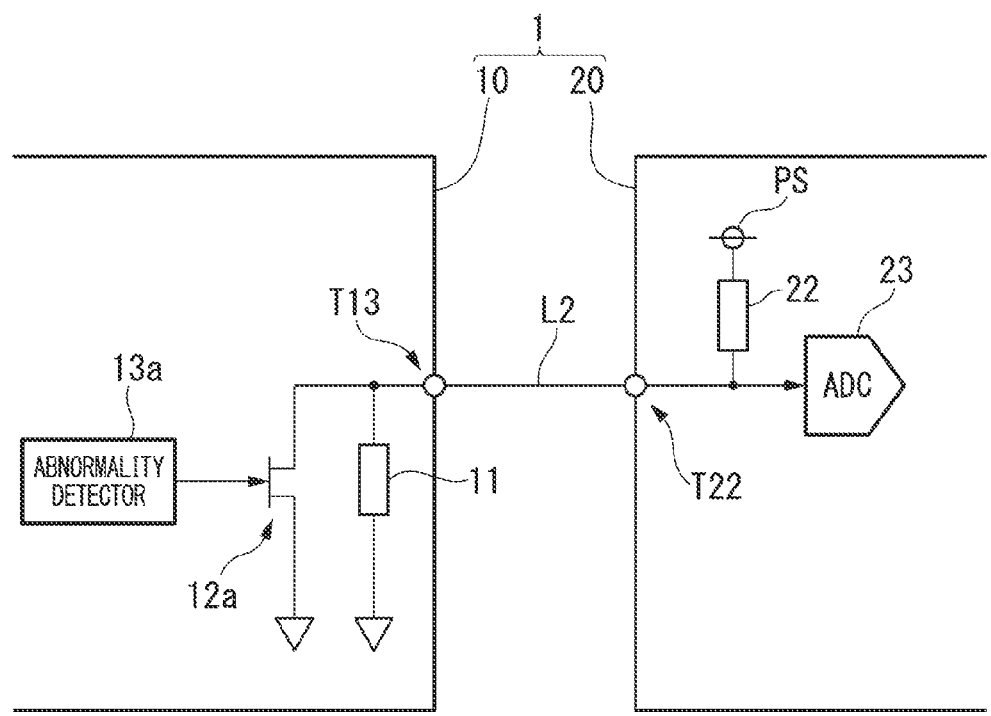
FIG. 2 is a block diagram showing a variation example of a signal processing apparatus according to the first embodiment of the present invention.

FIG. 2 is a block diagram showing a variation example of a signal processing apparatus according to the first embodiment of the present invention. The minimum constitution required for the recognition of the type of an interface module 10 and the notification of the abnormality in the interface module 10 is shown in FIG. 2, and other elements are omitted. In FIG. 2, blocks that are similar to those in FIG. 1 are assigned the same reference numerals.

As shown in FIG. 2, a signal processing apparatus 1 according to the variation example has a constitution that a switch 12a (first switch, changer) and an abnormality detector 13a are provided in the interface module 10 instead of the switch 12 and the abnormality detector 13. The switch 12a is an electronic switch, for example, FET (Field Effect Transistor). The switch 12a may be serially connected to a resistance 11. The abnormality detector 13a electrically detects the abnormality in the interface module 10. When the abnormality detector 13a detects the abnormality, the abnormality detector 13a changes the switch 12a to the ON state. In particular, in the signal processing apparatus 1 according to the variation example, a power source (not shown) is provided in the interface module 10, and the switch 12a and the abnormality detector 13a, which are driven by the power supplied from the power source, are provided.

The signal processing apparatus 1 according to the variation example has similar constitution to that of the signal processing apparatus 1 shown in FIG. 1 except that the power source is provided in the interface module 10 and that the switch 12a and the abnormality detector 13a, which are driven by the power supplied from the power source, are provided in the interface module 10. Therefore, as with the case of the signal processing apparatus 1 shown in FIG. 1, the type of the interface module 10 can be recognized without significantly increasing the cost or the number of wirings. In addition, in the variation example, not only the recognition of the type of the interface module 10, but also the notification of the abnormality in the interface module 10 is possible.

Second Embodiment

Figure 3A:
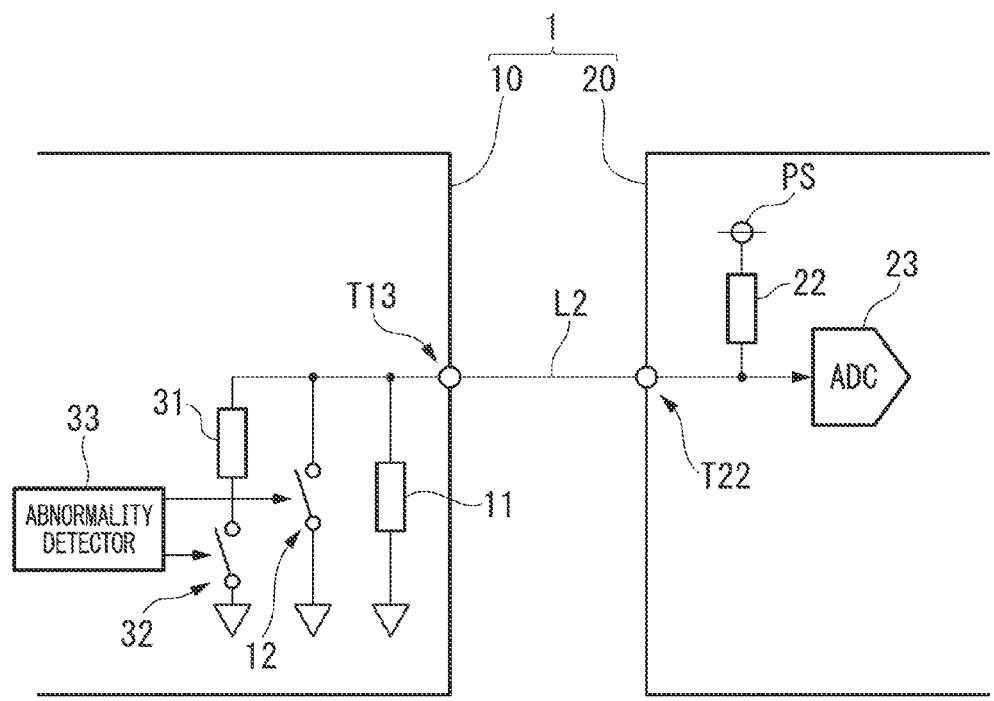
FIG. 3A is a block diagram showing the main parts of the constitution of a signal processing apparatus according to a second embodiment of the present invention.
Figure 3B:
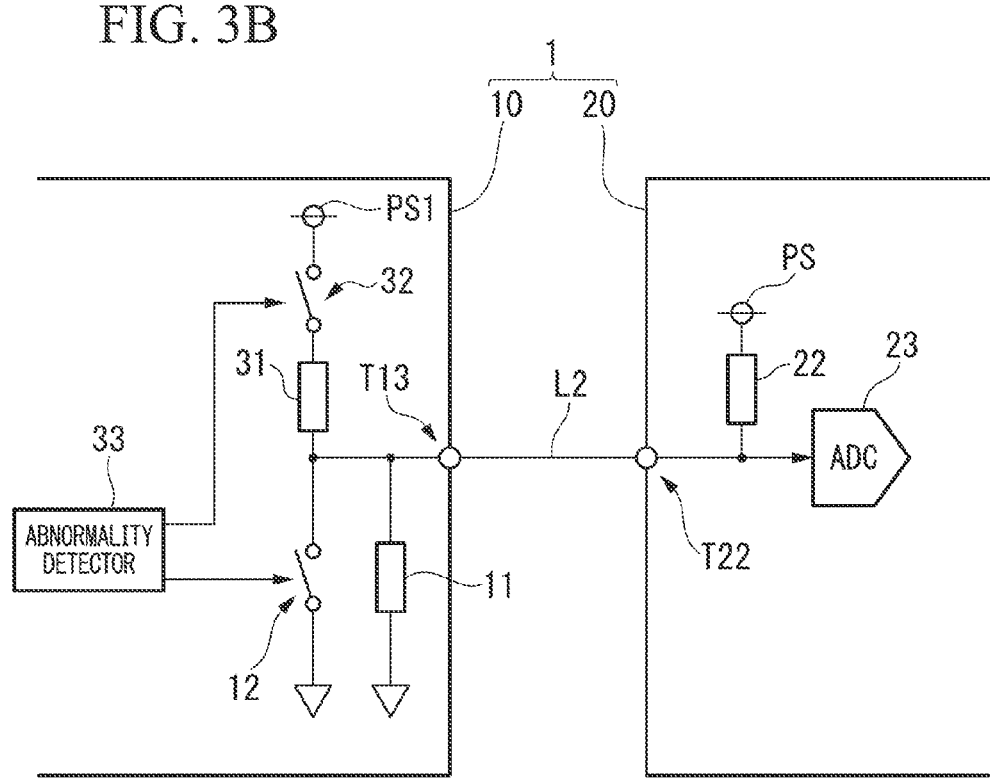
FIG. 3B is a block diagram showing the main parts of the constitution of the signal processing apparatus according to the second embodiment of the present invention.

FIGS. 3A and 3B are block diagrams showing the main parts of the constitution of a signal processing apparatus according to a second embodiment of the present invention. As with the case of FIG. 2, the minimum constitution required for the recognition of the type of an interface module 10 and the notification of the abnormality in the interface module 10 is shown in FIGS. 3A and 3B, and blocks that are similar to those in FIG. 1 are assigned the same reference numerals. The same applies to subsequent drawings.

As shown in FIGS. 3A and 3B, in a signal processing apparatus 1 according to the second embodiment, compared to the constitution shown in FIG. 1, a circuit (abnormality notification circuit: changer) including a resistance 31 (abnormality notification resistance) and a switch 32 (second switch) is newly provided in the interface module 10, an abnormality detector 33 is provided in the interface module 10 instead of the abnormality detector 13. The signal processing apparatus 1 having such constitution can perform notification of the type of the abnormality in the interface module 10.

The signal processing apparatus 1 shown in FIG. 3A has a constitution that a power source is not provided in the interface module 10, and the signal processing apparatus 1 shown in FIG. 3B has a constitution that a power source PS1 is provided in the interface module 10. In the signal processing apparatus 1 shown in FIG. 3A, the abnormality notification circuit is parallelly connected to a resistance 11 between the connection terminal T13 and the ground, on the other hand, in the signal processing apparatus 1 shown in FIG. 3B, the abnormality notification circuit is serially in connected to the resistance 11 between the power source PS1 and the ground.

The resistance 31 is for notifying the type of the abnormality in the interface module 10. In any of the signal processing apparatus 1 shown in FIG. 3A and that shown in FIG. 3B, the resistance value of the resistance 31 is set so that the voltage at a connection terminal T22 during OFF state of the switch 32 is different from that during the ON state of the switch 32. One end of the resistance 31 is in connection with one end of the resistance 11, and the other end of the resistance 31 is in connection with one end of the switch 32.

As with the case of the switch 12 shown in FIG. 1, the switch 32 is a mechanical switch used for notifying a signal processing module 20 of the abnormality in the interface module 10. In the signal processing apparatus 1 shown in FIG. 3A, the other end of the switch 32 is in connection with ground, on the other hand, in the signal processing apparatus 1 shown in FIG. 3B, the other end of the switch 32 is in connection with the power source PS1.

As with the case of the abnormality detector 13 shown in FIG. 1, the abnormality detector 33 mechanically detects the abnormality in the interface module 10. The abnormality detector 33 changes one of the switch 12 and the switch 32 to the ON state depending on the type of the detected abnormality. The abnormality in the interface module 10 includes, for example, a misalignment of a connection line L0 connected to a field device FD, and operations of a manual switch (not shown) provided in the interface module 10.

As with the case of the signal processing apparatus 1 shown in FIG. 1, since both ends of the resistance 11 are shorted when the abnormality detector 33 changes the switch 12 to the ON state, the digital signal output from ADC 23 indicates 0 [V]. On the other hand, when the abnormality detector 33 changes the switch 32 to the ON state, the resistances 11 and 31 are parallelly connected between the connection terminal T13 and the ground in the signal processing apparatus 1 shown in FIG. 3A and the resistances 11 and 31 are serially connected between the power source PS1 and the ground in the signal processing apparatus 1 shown in FIG. 3B. Therefore, the digital signal output from the ADC 23 indicates a voltage depending on the resistances 11 and 31, which are parallelly or serially connected each other, and the resistance 22.

As stated above, in the second embodiment, by changing one of the switch 12 and the switch 32 to the ON state depending on the type of the abnormality detected by the abnormality detector 33, the ADC 23 can output digital signals, which indicate different voltages from each other. Thereby, if the abnormality detected by the abnormality detector 33 and the voltage indicated by the digital signal output from the ADC 23 are previously associated, the notification of the type of the abnormality is possible.

In the signal processing apparatus 1 shown in FIG. 3B, a switch and an abnormality detector which are similar to the switch 12a and the abnormality detector 13a shown in FIG. 2 can be used instead of the switches 12 and 32 and the abnormality detector 33. In particular, instead of the mechanical switches 12 and 32 and the abnormality detector 33 mechanically detecting the abnormality in the interface module 10, a switch and an abnormality detector (the switch and the abnormality detector can detect the type of the abnormality), which are similar to the switch 12a and the abnormality detector 13a driven by the power supplied from the power source PS1, can be provided.

Third Embodiment

Figure 4:
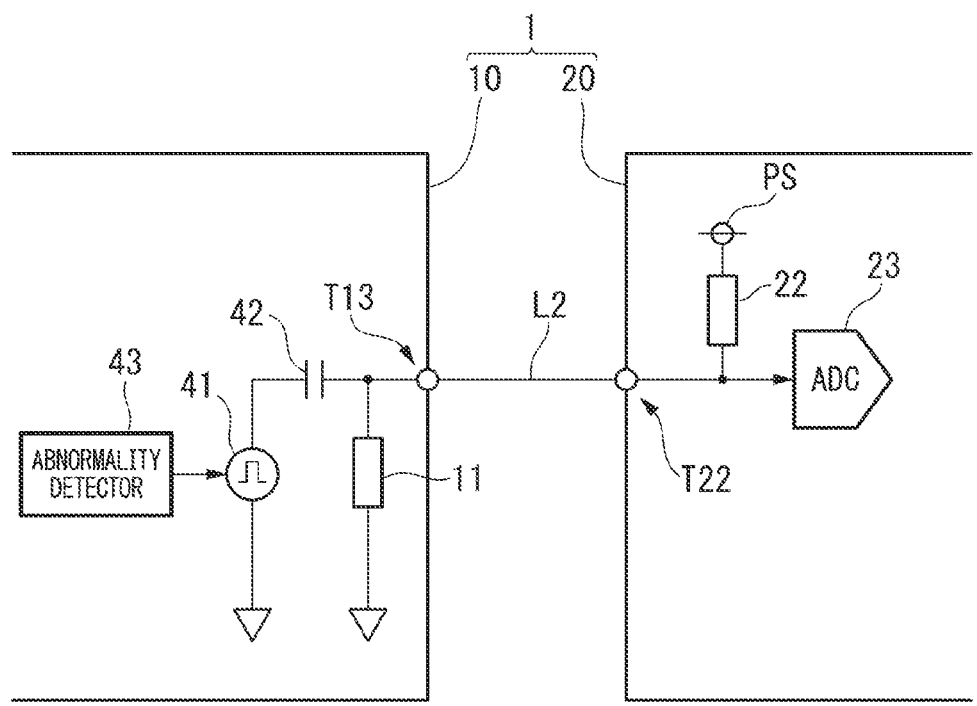
FIG. 4 is a block diagram showing the main parts of the constitution of a signal processing apparatus according to a third embodiment of the present invention.

FIG. 4 is a block diagram showing the main parts of the constitution of a signal processing apparatus according to a third embodiment of the present invention. As shown in FIG. 4, instead of the switch 12 and the abnormality detector 13 shown in FIG. 1, an oscillator 41 and a capacitor 42, and an abnormality detector 43 are provided in a signal processing apparatus 1 according to the third embodiment. The signal processing apparatus 1 having such constitution notifies an abnormality in an interface module 10 by a radio-frequency signal.

One end of the oscillator 41 is in connection with one end of a resistance 11 via the capacitor 42 (alternating current coupling), and the other end of the oscillator 41 is in connection with ground. The oscillator 41 outputs a square wave or a sine wave radio-frequency signal under the control of the abnormality detector 43. The capacitor 42 alternating-current couples the oscillator 41 to the resistance 11. In particular, the capacitor 42 transmits the radio-frequency signal output from the oscillator 41, but blocks direct-current components supplied from a signal processing module 20 to the interface module 10. The abnormality detector 43 electrically detects the abnormality in the interface module 10. When the abnormality detector 43 detects the abnormality, the abnormality detector 43 makes the oscillator 41 oscillate, or changes the oscillation frequency of the oscillator 41 in the oscillation state.

As stated above, in the third embodiment, when the abnormality detector 43 detects the abnormality in the interface module 10, the abnormality detector 43 makes the oscillator 41 oscillate, or changes the oscillation frequency of the oscillator 41 in the oscillation state. Thereby, the abnormality in the interface module 10 can be notified to the signal processing module 20 by the radio-frequency signal. The resistance 11 and the resistance 22 divide the source voltage. The radio-frequency signal output from the oscillator 41 is superimposed on a voltage at the resistance 11 of the divided voltages. Therefore, if the voltage at the resistance 11 and the radio-frequency signal are separated by the signal processing module 20, the recognition of the type of the interface module 10 and the recognition of the abnormality in the interface module 10 can be simultaneously performed.

The abnormality detector 43 may be configured to detect the type of the abnormality in the interface module 10, and to set the oscillation frequency of the oscillator 41 depending on the type of the detected abnormality. Thereby, not only the notification that the abnormality occurs in the interface module 10, but also the notification of the type of the abnormality in the interface module 10 by the radio-frequency signal is possible.

Fourth Embodiment

Figure 5A:
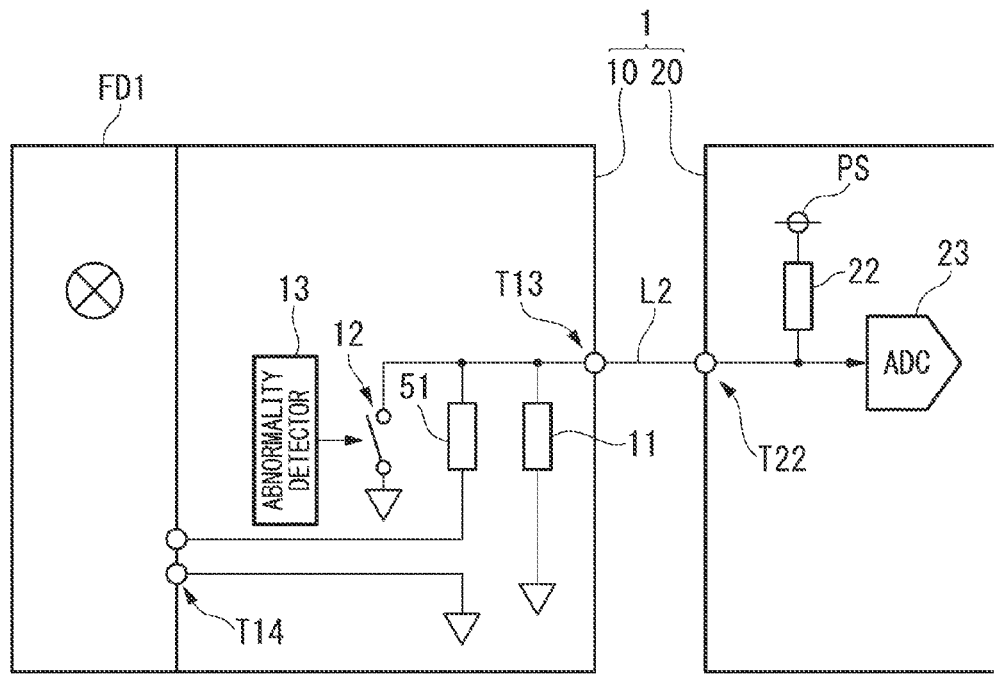
FIG. 5A is a block diagram showing the main parts of the constitution of a signal processing apparatus according to a fourth embodiment of the present invention.
Figure 5B:
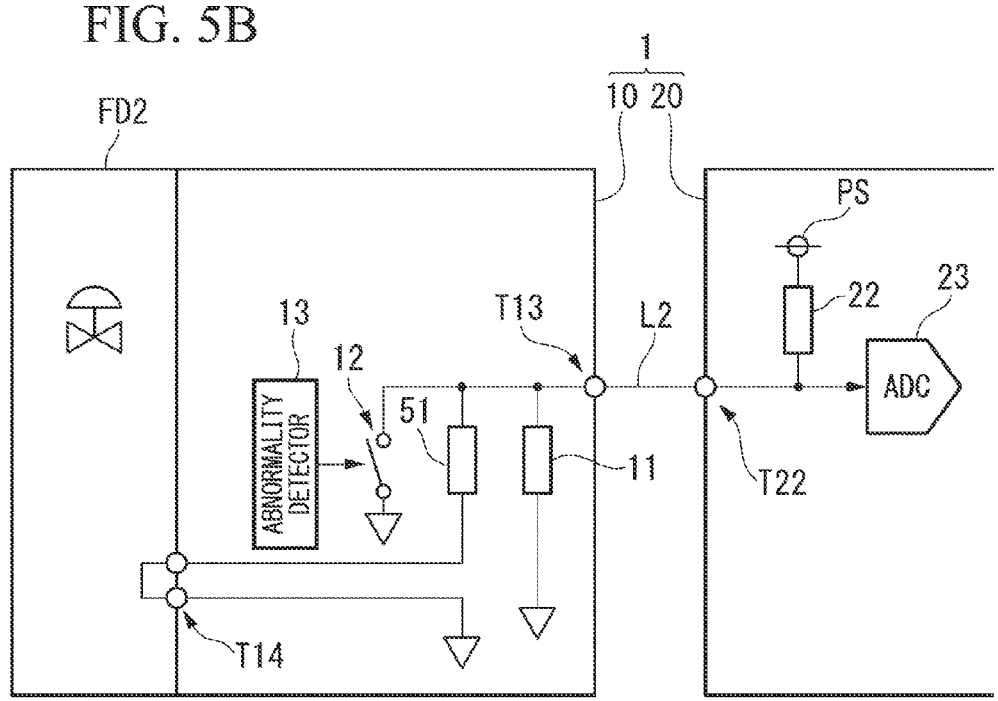
FIG. 5B is a block diagram showing the main parts of the constitution of the signal processing apparatus according to the fourth embodiment of the present invention.

FIGS. 5A and 5B are block diagrams showing the main parts of the constitution of a signal processing apparatus according to a fourth embodiment of the present invention. As shown in FIGS. 5A and 5B, a signal processing apparatus 1 according to the fourth embodiment includes a circuit (device type identification circuit) including a resistance 51 (device type identification resistance) and an identification terminal T14 (device type identification terminal). The signal processing apparatus 1 having such constitution can perform notification of a type of a field device FD connected to an interface module 10.

FIG. 5A shows a state that a sensor device FD1 as the field device FD is in connection with the interface module 10. On the other hand, FIG. 5B shows a state that a valve device FD2 as the field device FD is in connection with the interface module 10.

The resistance 51 is for notifying the type of the field device FD connected to the interface module 10. The resistance value of the resistance 51 is set so that the voltage at a connection terminal T22 when the identification terminal T14 is open is different from that when the identification terminal T14 is shorted. One end of the resistance 51 is in connection with one end of a resistance 11, and the other end of the resistance 51 is in connection with one end of the identification terminal T14. The identification terminal T14 includes a pair of terminals in which is opened or shorted depending on the type of the field device FD connected to the interface module 10. One end of the identification terminal T14 is in connection with the other end of the resistance 51, and the other end of the identification terminal T14 is in connection with ground.

As shown in FIG. 5A, since the identification terminal T14 is opened when the sensor device FD1 is in connection with the interface module 10, the digital signal output from ADC 23 indicates a voltage at the resistance 11 of the divided voltages, into which the resistances 11 and 22 divide the source voltage. On the other hand, as shown in FIG. 5B, since the identification terminal T14 is shorted when the valve device FD2 is in connection with the interface module 10, the digital signal output from the ADC 23 indicates a voltage at combined resistance (the combined resistance consists of the resistances 11 and 51 parallelly connected each other between the connection terminal T13 and the ground) of the divided voltages, into which the resistance 22 and the combined resistance divide the source voltage.

As stated above, in the fourth embodiment, by opening or shorting the identification terminal T14 provided in the interface module 10, the digital signals output from the ADC 23 indicate different voltages from each other. Thereby, if the type of the field device FD connected to the interface module 10 and the voltage indicated by the digital signal output from the ADC 23 are previously associated, the notification of the type of the field device FD connected to the interface module 10 is possible.

In the signal processing apparatus 1 shown in FIGS. 5A and 5B, the circuit (device type identification circuit) including the resistance 51 and the identification terminal T14 is parallelly connected to the resistance 11 between the connection terminal T13 and the ground. As with the case of the abnormality notification circuit (the circuit including the resistance 31 and the switch 32) shown in FIG. 3B, the device type identification circuit may be serially connected to the resistance 11. However, the constitution presupposes that the power source PS1 is provided in the interface module 10 (refer to FIG. 3B).

In the fourth embodiment, the notification of the type of the field device FD is performed by opening or shorting the identification terminal T14. However, the notification of the type of the field device FD may be performed by connecting a resistance in which the resistance value is set based on the type of the field device FD to the identification terminal T14.

Fifth Embodiment

Figure 6:
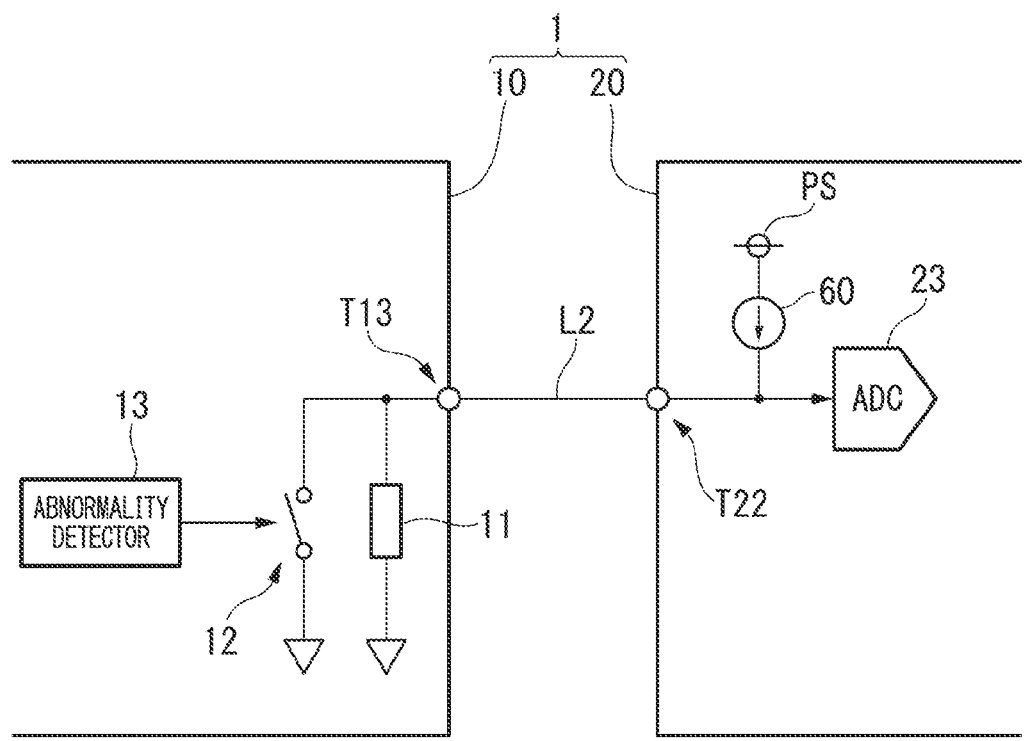
FIG. 6 is a block diagram showing the main parts of the constitution of a signal processing apparatus according to a fifth embodiment of the present invention.

FIG. 6 is a block diagram showing the main parts of the constitution of a signal processing apparatus according to a fifth embodiment of the present invention. As shown in FIG. 6, the signal processing apparatus 1 according to the fifth embodiment includes a constant current source 60 provided in a signal processing module 20 instead of the resistance 22. The constant current source 60 generates a constant current using power supplied from a power source PS, and supplies the constant current to a resistance 11 via a connection terminal T22.

In the signal processing apparatus 1 shown in FIG. 6, since the constant current generated by the constant current source 60 is supplied to the resistance 11 provided in an interface module 10, a voltage depending on the resistance value of the resistance 11 appears at the connection terminal T22 of the signal processing module 20. Therefore, if the resistance value of the resistance 11 is different for each interface module 10, the identification of the type of the interface module 10 is possible.

<Process Control System>

Figure 7:
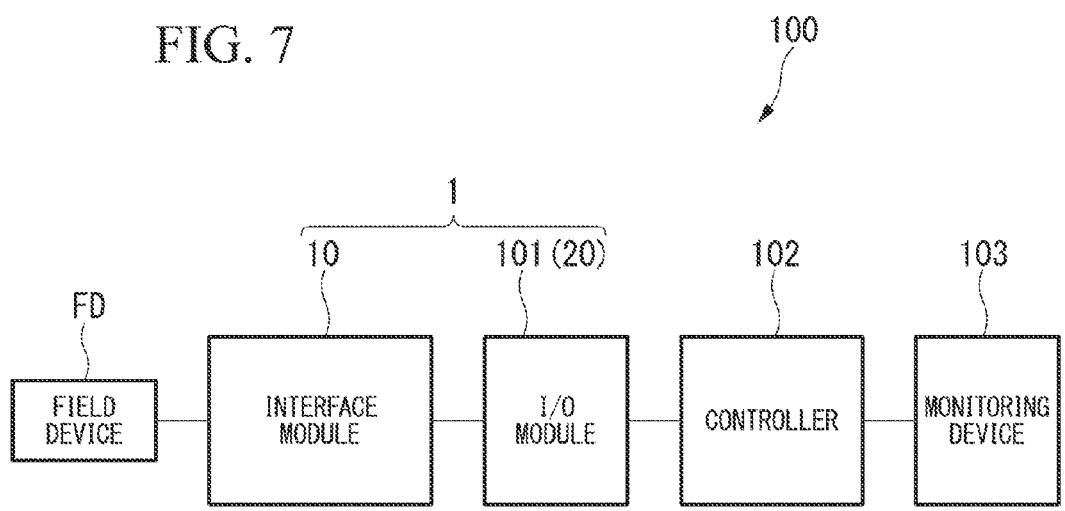
FIG. 7 is a block diagram showing an example of overall constitution of a process control system using a signal processing apparatus according to embodiments of the present invention.

FIG. 7 is a block diagram showing an example of overall constitution of a process control system using a signal processing apparatus according to embodiments of the present invention. A process control system 100 shown in FIG. 7 includes a field device FD, an interface module 10, an I/O module 101, a controller 102, and a monitoring device 103. The controller 102 controls the field device FD under the monitoring of the monitoring device 103 to control an industrial process implemented in a plant, a factory, and the like. A line concentration device referred to as a junction box or a marshaling may be provided between the field device FD and the interface module 10.

The field device FD is similar to that shown in FIG. 1, is installed on site, for example, a plant or a factory, and performs at least one of measuring of a measuring target and operating an operation target required for the control of the industrial process. The interface module 10 corresponds to the interface module 10 of the signal processing apparatus 1 described in the first to fifth embodiments. The I/O module 101 is provided between the field device FD and the controller 102 (to be exact, between the interface module 10 and the controller 102), and processes signals input and output between them. The I/O module 101 corresponds to the signal processing module 20 of the signal processing apparatus 1 described in the first to fifth embodiments.

The controller 102 controls the field device FD under the monitoring of the monitoring device 103. Specifically, the controller 102 collects measured data from the field device FD (for example, sensor device), calculates control data for controlling the field device FD (for example, valve device), and sends the control data to the field device FD (for example, valve device).

The monitoring device 103 is operated by an operator in, for example, a plant, and is used for the monitoring of the process. Specifically, the monitoring device 103 transmits to and receives from the controller 102 various parameters to monitor the field device FD. For example, the monitoring device 103 receives parameters set in the field device FD from the controller 102 to understand the current measuring conditions and the like, and makes the controller 102 set a new parameter of the field device FD to change the measuring conditions and the like.

In the process control system 100 having the above-state constitution, the identification result (recognition result) of the type of the interface module 10 in the I/O module 101 as the signal processing module 20 of the signal processing apparatus 1 is collected by the monitoring device 103 via the controller 102. In addition, the recognition result of the abnormality in the I/O module 101 and the identification result of the type of the field device FD are also collected by the monitoring device 103. Therefore, the operator of the monitoring device 103 can understand the type of the interface module 10 or the field device FD installed in a plant and the like, and understand the error occurrence in the interface module 10.

<Measuring and Recording System>

Figure 8:
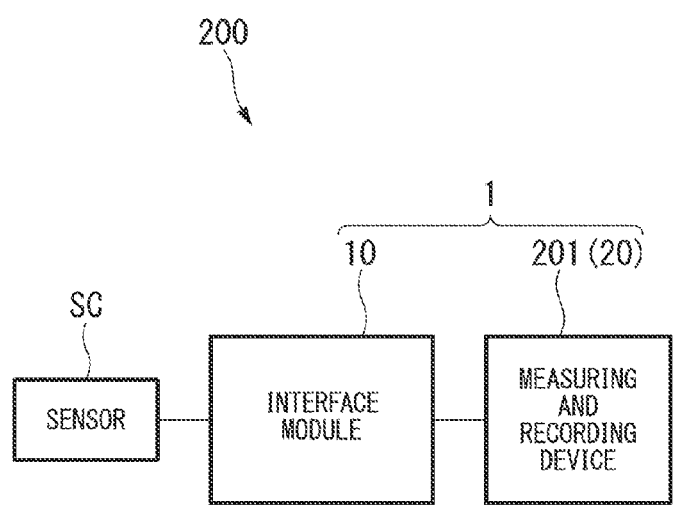
FIG. 8 is a block diagram showing an example of a measuring and recording system using a signal processing apparatus according to embodiments of the present invention.

FIG. 8 is a block diagram showing an example of a measuring and recording system using a signal processing apparatus according to embodiments of the present invention. A measuring and recording system 200 shown in FIG. 8 includes a sensor SC, an interface module 10, and a measuring and recording device 201. The measuring and recording device 201 measures or records various physical quantity (for example, a pressure, a temperature, a flow rate, and optical power) using the detected signal from the sensor SC.

The sensor SC is attached to a measuring target, and detects the various physical quantity. The interface module 10 corresponds to the interface module 10 of the signal processing apparatus 1 described in the first to fifth embodiments. The measuring and recording device 201 performs pre-determined processing (measuring processing or recording processing) for the detected signal input into the measuring and recording device 201 from the sensor SC via the interface module 10. The measuring and recording device 201 corresponds to the signal processing module 20 of the signal processing apparatus 1 described in the first to fifth embodiments.

In the measuring and recording system 200 having the above-stated constitution, the measuring and recording device 201 as the signal processing module 20 of the signal processing apparatus 1 identifies (recognizes) the type of the interface module 10, the abnormality in the interface module 10, and the type of the sensor SC. Therefore, for example, when the operator of the measuring and recording device 201 instructs the display or output of the recognized information, not only the type of the interface module 10 or the sensor SC, but also the error occurrence in the interface module 10 can be understood.

Although the foregoing has been a description of signal processing apparatuses according to embodiments of the present invention, the present invention is not limited to the embodiments, and can be freely modified within the scope of the present invention. For example, in the embodiments, although the voltage at the connection terminal T22 is detected to recognize the type of the interface module 10, electrical current flowing through the connection terminal T22 is detected to recognize the type of the interface module 10. The signal processing apparatus according to embodiments of the present invention is applicable to, in addition to the process control system 100 and the measuring and recording system 200, various systems using a plurality of measuring targets and operation targets.

What is claimed is:

1. A signal processing apparatus, comprising:
   an interface module comprising an identification resistance for identifying the interface module, the interface module being connectable to a device configured to perform at least one of measuring of a measuring target and operating of an operation target; and
   a signal processing module comprising:
      a first connection terminal connected to one end of the identification resistance;
      a first power source connected to the identification resistance via the first connection terminal;
      a detector configured to detect any one of voltage and electrical current at the first connection terminal; and
      a hardware signal processor configured to process signals received from and transmitted to the device,
   wherein the interface module further comprises:
      a changer configured to change any one of voltage and electrical current at the identification resistance;
      an abnormality detector configured to detect an abnormality in the interface module and to change a current operational state of the changer; and
      a second connection terminal connected to the first connection terminal,
   wherein the one end of the identification resistance is connected to the first connection terminal via the second connection terminal,
   wherein another end of the identification resistance is connected to ground,
   wherein the changer comprises a first switch parallelly connected to the identification resistance between the second connection terminal and the ground,
   wherein when the abnormality detector detects an abnormality in the interface module, the abnormality detector is configured to change the first switch to an ON state,
   wherein the changer further comprises an abnormality notification circuit, the abnormality notification circuit comprising an abnormality notification resistance used for notifying the type of abnormality in the interface module and a second switch connected to the abnormality notification resistance, and
   wherein the abnormality detector is configured to change any one of the first switch and the second switch to an ON state depending on the type of the detected abnormality of the interface module.

2. The signal processing apparatus according to claim 1, wherein:
   the interface module further comprises a second power source connected to one end of the abnormality notification circuit;
   another end of the abnormality notification circuit is connected to the one end of the identification resistance; and
   the second switch, the abnormality notification resistance, and the identification resistance are serially connected between the second power source and the ground.

3. The signal processing apparatus according to claim 1, wherein the abnormality notification circuit is parallelly connected to the identification resistance between the second connection terminal and the ground.

4. The signal processing apparatus according to claim 1, wherein:
   the interface module further comprises a device type identification circuit; and
   the device type identification circuit comprises:
      a device type identification resistance configured to identify the type of the device; and
      a device type identification terminal connected to the device type identification resistance and configured to be opened or shorted depending on the type of the device.

5. The signal processing apparatus according to claim 4, wherein:
the interface module further comprises a second power source connected to one end of the device type identification circuit;
another end of the device type identification circuit is connected to the one end of the identification resistance; and
the device type identification terminal, the device type identification resistance, and the identification resistance are serially connected between the second power source and the ground.

6. The signal processing apparatus according to claim 4, wherein:
the device type identification circuit is parallelly connected to the identification resistance between the second connection terminal and the ground.

7. The signal processing apparatus according to claim 1, wherein:
the interface module further comprises a device type identification circuit; and
the device type identification circuit comprises:
a device type identification resistance configured to identify the type of the device; and
a device type identification terminal connected to a resistance having a resistance value depending on the type of the device.

8. The signal processing apparatus according to claim 7, wherein:
the interface module further comprises a second power source connected to one end of the device type identification circuit;
another end of the device type identification circuit is connected to the one end of the identification resistance; and
the device type identification terminal, the device type identification resistance, and the identification resistance are serially connected between the second power source and the ground.

9. The signal processing apparatus according to claim 7, wherein:
the device type identification circuit is parallelly connected to the identification resistance between the second connection terminal and the ground.

10. The signal processing apparatus according to claim 1, wherein:
the signal processing module further comprises a voltage dividing resistance provided between the first power source and the first connection terminal; and
the voltage dividing resistance is serially connected to the identification resistance via the first connection terminal, and configured to divide the voltage of the power source.

11. The signal processing apparatus according to claim 1, wherein the signal processing module further comprises a constant current source configured to supply constant electrical current to the identification resistance via the first connection terminal.

12. The signal processing apparatus according to claim 1, wherein:
the detector comprises an analog-to-digital converter; and
the analog-to-digital converter comprises an input terminal connected to the first connection terminal, and is configured to convert any one of voltage and electrical current at the first connection terminal into a digital signal.

13. The signal processing apparatus according to claim 12, wherein:
the signal processing module further comprises a recognizer disposed between the analog-to-digital converter and the signal processor; and
the recognizer is configured to recognize the type of the interface module based on the digital signal output from the analog-to-digital converter, and to input the recognition result into the signal processor.

14. The signal processing apparatus according to claim 12, wherein:
the signal processing module further comprises an abnormality processor disposed between the analog-to-digital converter and the signal processor; and
the abnormality processor is configured to recognize an abnormality in the interface module based on the digital signal output from the analog-to-digital converter, and to input the recognition result into the signal processor.

15. A signal processing apparatus, comprising:
an interface module comprising an identification resistance for identifying the interface module, the interface module being connectable to a device configured to perform at least one of measuring of a measuring target and operating of an operation target; and
a signal processing module comprising:
a first connection terminal connected to one end of the identification resistance;
a first power source connected to the identification resistance via the first connection terminal;
a detector configured to detect any one of voltage and electrical current at the first connection terminal; and
a hardware signal processor configured to process signals received from and transmitted to the device,
wherein the interface module further comprises:
a changer configured to change any one of voltage and electrical current at the identification resistance;
an abnormality detector configured to detect an abnormality in the interface module and to change a current operational state of the changer; and
a second connection terminal connected to the first connection terminal,
wherein the one end of the identification resistance is connected to the first connection terminal via the second connection terminal,
wherein another end of the identification resistance is connected to ground,
wherein the changer further comprises an abnormality notification circuit, the abnormality notification circuit comprising an abnormality notification resistance used for notifying the abnormality in the interface module and a switch connected to the abnormality notification resistance, and
wherein the abnormality detector is configured to change the switch to an ON state when the abnormality detector detects the abnormality in the interface module.

16. The signal processing apparatus according to claim 15, wherein:
the interface module further comprises a second power source connected to one end of the abnormality notification circuit;
another end of the abnormality notification circuit is connected to the one end of the identification resistance; and
the switch, the abnormality notification resistance, and the identification resistance are serially connected between the second power source and the ground.

17. The signal processing apparatus according to claim 15, wherein the abnormality notification circuit is parallelly connected to the identification resistance between the second connection terminal and the ground.

* * * * *